(12) United States Patent
Chen et al.

(10) Patent No.: US 7,279,387 B2
(45) Date of Patent: Oct. 9, 2007

(54) METHOD FOR FABRICATING ASYMMETRIC SEMICONDUCTOR DEVICE

(75) Inventors: Yi-Cheng Chen, Mingjian Township, Nantou County (TW); Earic Liu, Dongshih Township, Taichung County (TW); Yu-Kun Chen, Hsinchu (TW); Gene Li, Jhubei (TW)

(73) Assignee: United Microelectronics Corp., Hsinchu (TW)

( * ) Notice: Subject to any disclaimer, the term of this patent is extended or adjusted under 35 U.S.C. 154(b) by 149 days.

(21) Appl. No.: 11/067,287

(22) Filed: Feb. 25, 2005

(65) Prior Publication Data

US 2006/0194380 A1    Aug. 31, 2006

(51) Int. Cl.
*H01L 21/336* (2006.01)
(52) U.S. Cl. .................. 438/286; 438/305; 438/308; 438/530
(58) Field of Classification Search ............. 438/286, 438/302, 303, 305, 306, 308, 525, 530
See application file for complete search history.

(56) References Cited

U.S. PATENT DOCUMENTS

| 5,344,787 | A  | * | 9/1994  | Nagalingam et al. ....... 438/298 |
| 5,403,772 | A  | * | 4/1995  | Zhang et al. ............... 438/166 |
| RE35,036  | E  | * | 9/1995  | Yabu et al. ................. 438/282 |
| 5,999,238 | A  | * | 12/1999 | Ihara ........................ 349/58 |
| 6,001,714 | A  | * | 12/1999 | Nakajima et al. ........... 438/525 |
| 6,911,717 | B2 | * | 6/2005  | Jyumonji ................... 257/659 |

FOREIGN PATENT DOCUMENTS

JP    6-188264    *   7/1994

* cited by examiner

*Primary Examiner*—Zandra V. Smith
*Assistant Examiner*—Toniae M. Thomas
(74) *Attorney, Agent, or Firm*—J.C. Patents

(57) ABSTRACT

A method for fabricating an asymmetric semiconductor device is provided. A substrate formed with at least one base structure of MOSFET thereon is provided, wherein the base structure includes a gate over the substrate and a source extension and a drain extension in the substrate beside the gate. The base structure is then treated with an anisotropic annealing source inclined in the source-to-drain direction of the base structure relative to the normal of the substrate, such that one of the source and drain extensions is shadowed by the gate and the other is annealed more.

20 Claims, 2 Drawing Sheets

METHOD FOR FABRICATING ASYMMETRIC SEMICONDUCTOR DEVICE

BACKGROUND OF THE INVENTION

1. Field of the Invention

The present invention relates to a semiconductor process. More particularly, the present invention relates to a method for fabricating an asymmetric semiconductor device, such as, an asymmetric metal-oxide-semiconductor field effect transistor (MOSFET).

2. Description of Related Art

An asymmetric semiconductor device is defined as a device having asymmetric doped regions. For example, an asymmetric MOSFET features that its gate-to-source overlap capacitance is different from its gate-to-drain overlap capacitance. The gate-to-drain overlap capacitance frequently acts as a component of the input capacitance and the output capacitance, hence is usually a serious performance detractor in lightly loaded CMOS circuits. In some cases, the gate-to-drain capacitance contribution is even nearly doubled from its original value due to the Miller Effect. Therefore, asymmetric MOSFETs play an important role in circuit performance improvement.

In the prior art, asymmetric semiconductor devices are fabricated through complicated implantation engineering and/or integration modification, instead of thermal annealing. It is because the conventional thermal annealing techniques are all immersion-type techniques, in which all doped regions are annealed under the same temperature. Accordingly, an effective method for fabricating asymmetric semiconductor devices is highly desired.

SUMMARY OF THE INVENTION

In view of the foregoing, this invention provides a method for fabricating an asymmetric semiconductor device, which utilizes an inclined anisotropic surface annealing source and a shadowing effect of a protrudent structure without complicated implantation engineering or integration modification.

According to a preferred embodiment of this invention, the method for fabricating an asymmetric semiconductor device is applied to a MOSFET fabricating process as follows. A substrate formed with a base structure of a MOSFET thereon is provided, wherein the base structure includes at least a gate over the substrate, and a source extension and a drain extension in the substrate beside the gate. The substrate is then treated using an anisotropic annealing source inclined in the source-to-drain direction of the base structure relative to the normal of the substrate, such that one of the source extension and the drain extension is shadowed by the gate and the other is annealed more.

In some embodiments of this invention, the anisotropic annealing source is tilted in the source-to-drain direction during the annealing step, so that only one of the source and drain extensions is shadowed by the gate. Alternatively, in other embodiments of this invention, the substrate is tilted in the source-to-drain direction, so that only one of the source and drain extensions is shadowed by the gate.

Since one of the source and drain extensions is shadowed by the gate, the other is annealed more by the anisotropic annealing source and can overlap more with the gate. Therefore, an asymmetric MOSFET can be easily fabricated without utilizing complicated implantation engineering or integration modification.

It is to be understood that both the foregoing general description and the following detailed description are exemplary, and are intended to provide further explanation of the invention as claimed.

DESCRIPTION OF THE PREFERRED EMBODIMENTS

Figure 1:
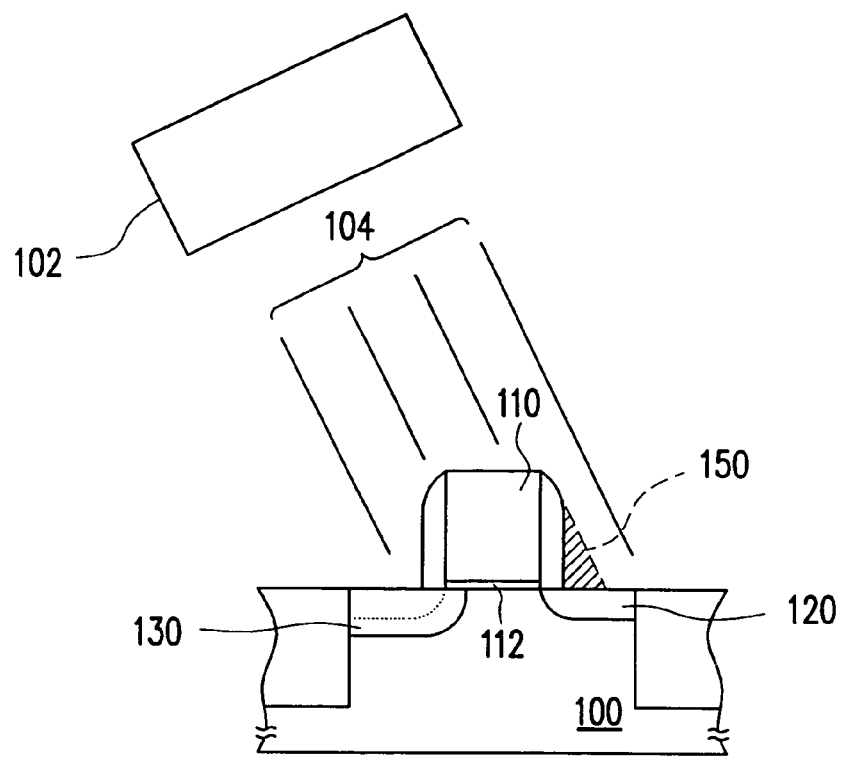
FIG. 1 illustrates a method for fabricating an asymmetric MOSFET according to an embodiment of this invention.

Referring to FIGS. 1-4, a substrate 100 formed with a base structure of a MOSFET thereon is provided. The base structure includes a gate 110, a gate dielectric layer 112 between the gate 110 and the substrate 100, and a drain extension 120 and a source extension 130 in the substrate 100 beside the gate 110. The base structure may be one of the base structures of MOS-type memory cells in a semi-finished memory array, or one of the base structures of MOS-type filter devices in a semi-finished filter array, wherein each MOS-type base structure has the same source-to-drain direction. The memory array may be a flash memory array in which more gate-to-source overlap is required to improve some electrical properties, for example, to facilitate source-side erase.

The MOS-type base structure can be fabricated through conventional processes including, for example, STI process, well implantation, threshold voltage implantation, gate stacking and offset spacer formation. Thereafter, a source extension 130 and a drain extension 120 can be implanted either symmetrically or asymmetrically, depending on design of the S/D extension engineering and the requirements in circuit performance optimization. The original profile of the source extension 130 is shown by the dotted line in FIGS. 1-4, which can be the same as that of the drain extension 120.

Figure 3:
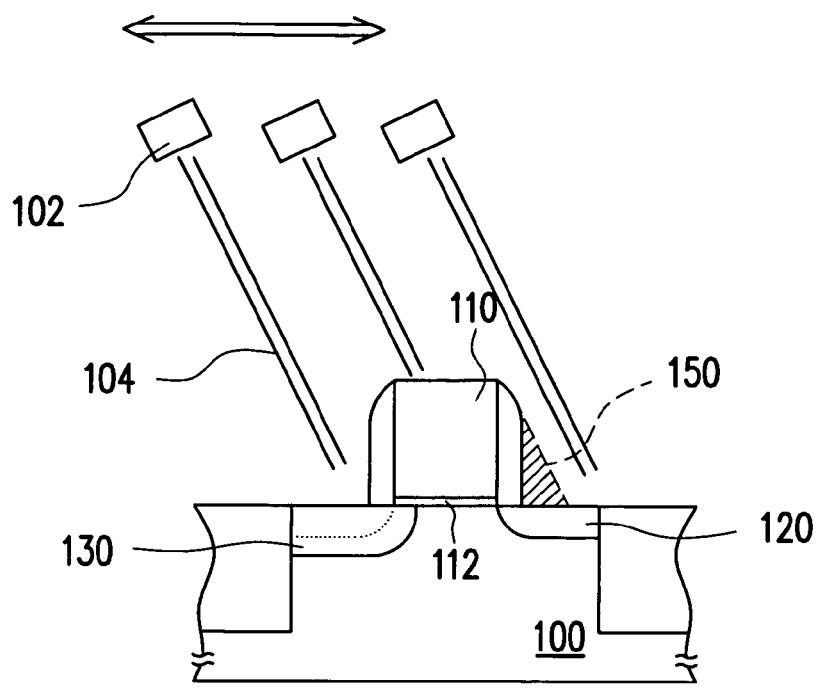
FIG. 3 illustrates a method for fabricating an asymmetric MOSFET according to still another embodiment of this invention.

Referring to FIG. 1 or 3, an anisotropic annealing source 104, such as, a laser beam or an arc source, generated by an annealing source generator 102 is then used to treat the base structure. The anisotropic annealing source 104 is inclined in the source-to-drain direction toward the source extension 130 relative to the normal axis of the substrate 100, such that the drain extension 120 is in the shadow 150 of the gate 110 and the source extension 130 annealed to overlap more with the gate 110. The tilt angle ranges from, for example but not limited to, about 5 degrees to about 30 degrees, depending on the height of the gate 110 and the width of the drain extension 120 required to shadow. Thereafter, if necessary, the anisotropic annealing source 104 can be turned to tilt toward the other side, i.e., the side of the drain extension 120, to annealing the drain extension 120.

It should be noted that in FIGS. 1 and 3, the extensions 120/130 may be drain/source extensions 120/130 or source/drain extensions 120/130. In addition, the substrate 100 may be treated using a motionless anisotropic annealing source 104, as shown in FIG. 1. Alternatively, the anisotropic annealing source 104 may be moved in the source-to-drain direction, as shown in FIG. 3. The annealing process is performed according to the process described in reference to FIG. 1 or 3 depending on the size of the anisotropic annealing source 104.

Figure 2:
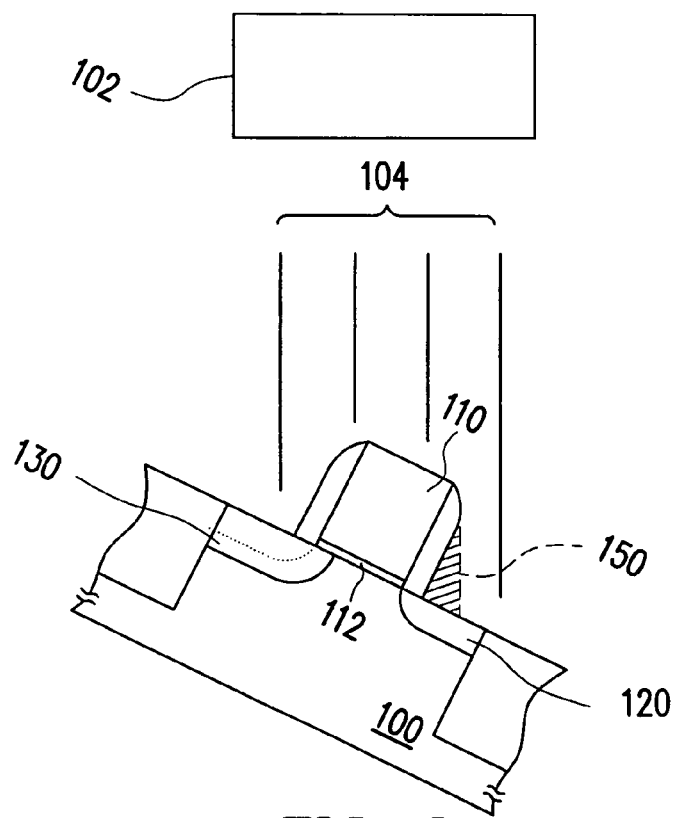
FIG. 2 illustrates a method for fabricating an asymmetric MOSFET according to another embodiment of this invention.

Alternatively, referring to FIG. 2, the anisotropic annealing source 104 is kept vertical, while the substrate 100 is tilted in the source-to-drain direction toward the drain side or the source side, so that the drain extension 120 or the source extension 130 is shadowed by the gate 110. Similarly, when the drain extension 120 is in the shadow 150 of the gate 110, the source extension 130 is annealed more by the anisotropic annealing source 104 to overlap more with the gate 110. The tilt angle ranges from, for example but not limited to, about 5 degrees to about 30 degrees, depending on the height of the gate 110 and the width of the drain extension 120 required to shadow. Thereafter, if necessary, the substrate 100 can be turned to tilt toward the source side to further anneal the drain extension 120.

Figure 4:
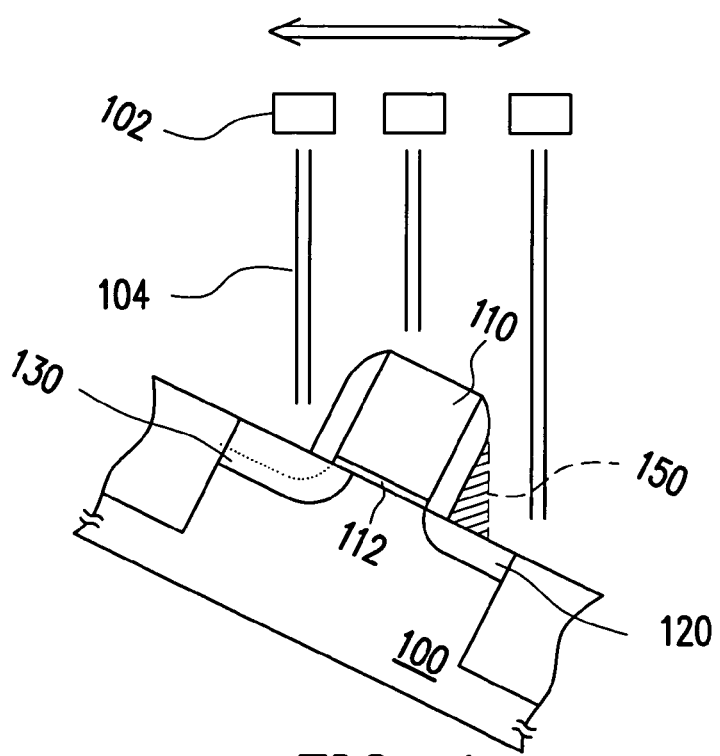
FIG. 4 illustrates a method for fabricating an asymmetric MOSFET according to yet another embodiment of this invention.

It should also be noted that in FIGS. 2 and 4, the extensions 120/130 may be drain/source extensions 120/130 or source/drain extensions 120/130. In addition, the substrate 100 may be treated using a motionless anisotropic annealing source 104, as shown in FIG. 2. Alternatively, the anisotropic annealing source 104 may be moved in a horizontal direction coplanar with the source-to-drain direction, as shown in FIG. 4. The annealing process is performed according to the process described in reference to FIG. 2 or 4 depending on the size of the anisotropic annealing source 104.

Next, spacer is formed on sidewalls of the gate 110, and S/D implantation and low thermal budget activation annealing (or surface annealing) steps are carried out to form source and drain regions. Thereafter, the remaining standard processes are conducted to complete the fabrication of the asymmetric MOSFET.

Since one of the source extension and the drain extension is being shadowed by the gate during the annealing step, the other is annealed more by the anisotropic annealing source and can overlap more with the gate. Therefore, an asymmetric MOSFET can be easily fabricated without complicated implantation engineering or integration modification.

It should also be noted that even though this invention is described using a MOSFET as an example, one of ordinary skills will understand that the method of this invention may also be applied to a substrate including at least a first doped region, a second doped region and a protrudent structure between the first and second doped regions to obtain an asymmetric structure. The semiconductor structure may be a capacitor or a wire, for example.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating an asymmetric MOSFET, comprising:
    providing a substrate having at least a base structure of a MOSFET thereon, wherein the base structure includes at least a gate over the substrate and a source extension and a drain extension in the substrate beside the gate; and
    treating the substrate using an anisotropic annealing source inclined in the source-to-drain direction of the base structure relative to a normal of the substrate, such that one of the source extension and the drain extension is shadowed by the gate and the other is annealed more by the anisotropic annealing source, wherein during the annealing step, the anisotropic annealing source is moved in a direction coplanar with the source-to-drain direction of the base structure.

2. The method according to claim 1, wherein during the annealing step, the anisotropic annealing source is tilted in the source-to-drain direction of the base structure so that one of the source extension and the drain extension is shadowed by the gate.

3. The method according to claim 1, wherein during the annealing step, the substrate is tilted in the source-to-drain direction of the base structure so that one of the source extension and the drain extension is shadowed by the gate.

4. The method according to claim 1, further comprising a subsequent annealing step, in which a direction of the anisotropic annealing source relative to the substrate is changed so that the one of the source extension and the drain extension shadowed by the gate in the annealing step is annealed by the anisotropic annealing source.

5. The method according to claim 1, wherein the anisotropic annealing source comprises a laser beam.

6. The method according to claim 1, wherein the anisotropic annealing source comprises an arc source.

7. The method according to claim 6, wherein the arc source comprises an ultraviolet light source.

8. The method according to claim 1, wherein before the substrate is treated with the anisotropic annealing source, the source extension and the drain extension are implanted symmetrically.

9. The method according to claim 1, wherein before the substrate is treated with the anisotropic annealing source, the source extension and the drain extension are implanted asymmetrically.

10. The method according to claim 1, wherein the substrate has an array of MOSFET base structures thereon, each of which has the same source-to-drain direction.

11. The method according to claim 10, wherein the array comprises a semi-finished memory array and each of the MOSFET base structures comprises a base structure of a MOS-type memory cell.

12. The method according to claim 10, wherein the array comprises a semi-finished filter array and each of the MOSFET base structures comprises a base structure of a MOS-type filter device.

13. A method for fabricating an asymmetric semiconductor device, comprising:
    providing a substrate having at least a first doped region, a second doped region and a protrudent structure between the first and second doped regions thereon; and
    treating the substrate using an anisotropic annealing source inclined in a specific direction of the first doped region to the second doped region relative to a normal of the substrate, such that one of the first doped region and the second doped region is shadowed by the protrudent structure and the other annealed more by the anisotropic annealing source, wherein during the annealing step, the anisotropic annealing source is moved in a direction coplanar with the specific direction.

14. The method according to claim 13, wherein during the annealing step, the anisotropic annealing source is tilted in the specific direction so that one of the first doped region and the second doped region is shadowed by the protrudent structure.

15. The method according to claim 13, wherein during the annealing step, the substrate is tilted in the specific direction so that one of the first doped region and the second doped region is shadowed by the protrudent structure.

16. The method according to claim 13, wherein the anisotropic annealing source comprises a laser beam.

17. The method according to claim 13, wherein the anisotropic annealing source comprises an arc source.

18. The method according to claim 17, wherein the arc source comprises an ultraviolet light source.

19. The method according to claim 13, wherein the protrudent structure comprises a capacitor.

20. The method according to claim 13, wherein the protrudent structure comprises a wire.

* * * * *